United States Patent
Nagashima et al.

(10) Patent No.: US 6,381,110 B1
(45) Date of Patent: Apr. 30, 2002

(54) METHOD AND APPARATUS FOR DETECTING ISOLATION FAULTS IN MOTOR/INVERTER SYSTEMS

(75) Inventors: James Nagashima, Cerritos; James Souther, Los Angeles; Scott D. Downer, Torrance, all of CA (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/519,414

(22) Filed: Mar. 6, 2000

(51) Int. Cl.[7] .................. H02H 7/00; H02H 5/04; H02M 3/24
(52) U.S. Cl. .................................. 361/23; 363/98
(58) Field of Search .................. 361/23, 18, 80, 361/82, 86, 87, 48, 47, 58, 98; 363/50, 54, 56, 98

(56) References Cited

U.S. PATENT DOCUMENTS 4,321,643 A * 3/1982 Vernier .................. 361/48
4,878,142 A * 10/1989 Bergman et al. ............. 361/80
5,687,049 A * 11/1997 Mangtani .................. 361/18

* cited by examiner

Primary Examiner—Rajnikant B. Patel
(74) Attorney, Agent, or Firm—Anthony Luke Simon

(57) ABSTRACT

A method for detecting an isolation fault in a system comprising a source connected an inverter through a circuit interrupter, the inverter connected to windings of an electric motor for driving the electric motor, is presented. The method comprising operating the inverter (1) to yield a zero net current in the windings of the electric motor other than leakage current resulting from an isolation fault or (2) to apply a voltage to at least one of the windings of the electric motor for a period of time given an ohmic level of an isolation fault to be detected; and measuring a voltage in the system, wherein a voltage level measured during this operation of the inverter is indicative of the existence of an isolation fault. Thereafter, the circuit interrupter is actuated in response to the voltage level indicative of the existence of the isolation fault.

9 Claims, 3 Drawing Sheets

US 6,381,110 B1

METHOD AND APPARATUS FOR DETECTING ISOLATION FAULTS IN MOTOR/INVERTER SYSTEMS

TECHNICAL FIELD

This invention relates generally to detecting isolation faults, and, more particularly, to a method and apparatus for detecting isolation faults in high-voltage motor/inverter systems.

BACKGROUND OF THE INVENTION

Electric vehicle high-voltage systems continually monitor the vehicle's direct current (DC) high-voltage bus electrical isolation from vehicle chassis ground. If this isolation is lost appropriate action can be taken, e.g., the high-voltage bus is typically disconnected. Existing systems measure isolation measure isolation loss by comparing voltage levels on the positive side to voltage levels on the negative side of the high-voltage bus. Once a predetermined threshold is reached an isolation loss is believed to have been detected and appropriate action is taken. The high-voltage supplied to various motors on a vehicle (e.g., a compressor motor, a power steering motor or a drive motor) is typically switched on and off to create an alternating current (AC) input for the motor. In certain situations ground faults may be challenging to detect, depending upon factors such as AC frequency of this motor input, capacitance level across the DC bus and a loss of AC isolation.

Existing ground fault circuit interrupters have a limited bandwidth of sensitivity for preventing erroneous detection of normal electrical noise, which would otherwise result in an undesired circuit interruption. With such systems isolation faults are generally detected upon closing of an inverter switch.

SUMMARY OF THE INVENTION

The present invention offers advantages and alternatives over the prior art in providing a method for detecting an isolation fault in a system comprising a source connected to an inverter through a circuit interrupter and the inverter connected to windings of an electric motor for driving the electric motor. The method comprising operating the inverter to yield a zero net current in the windings of the electric motor, other than leakage current resulting from an isolation fault, and measuring a voltage in the system, wherein a voltage level measured during the operation of the inverter to yield the zero net current in the windings of the electric motor is indicative of the existence of an isolation fault. Alternatively, the method comprises operating the inverter to apply a voltage to at least one of the windings of the electric motor for a period of time given an ohmic level of an isolation fault to be detected, and measuring a voltage in the system, wherein a voltage level measured during the operation of the inverter to apply the voltage to at least one of the windings of the electric motor for the period of time is indicative of the existence of the isolation fault. Thereafter, the circuit interrupter is actuated in response to the voltage level indicative of the existence of the isolation fault.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
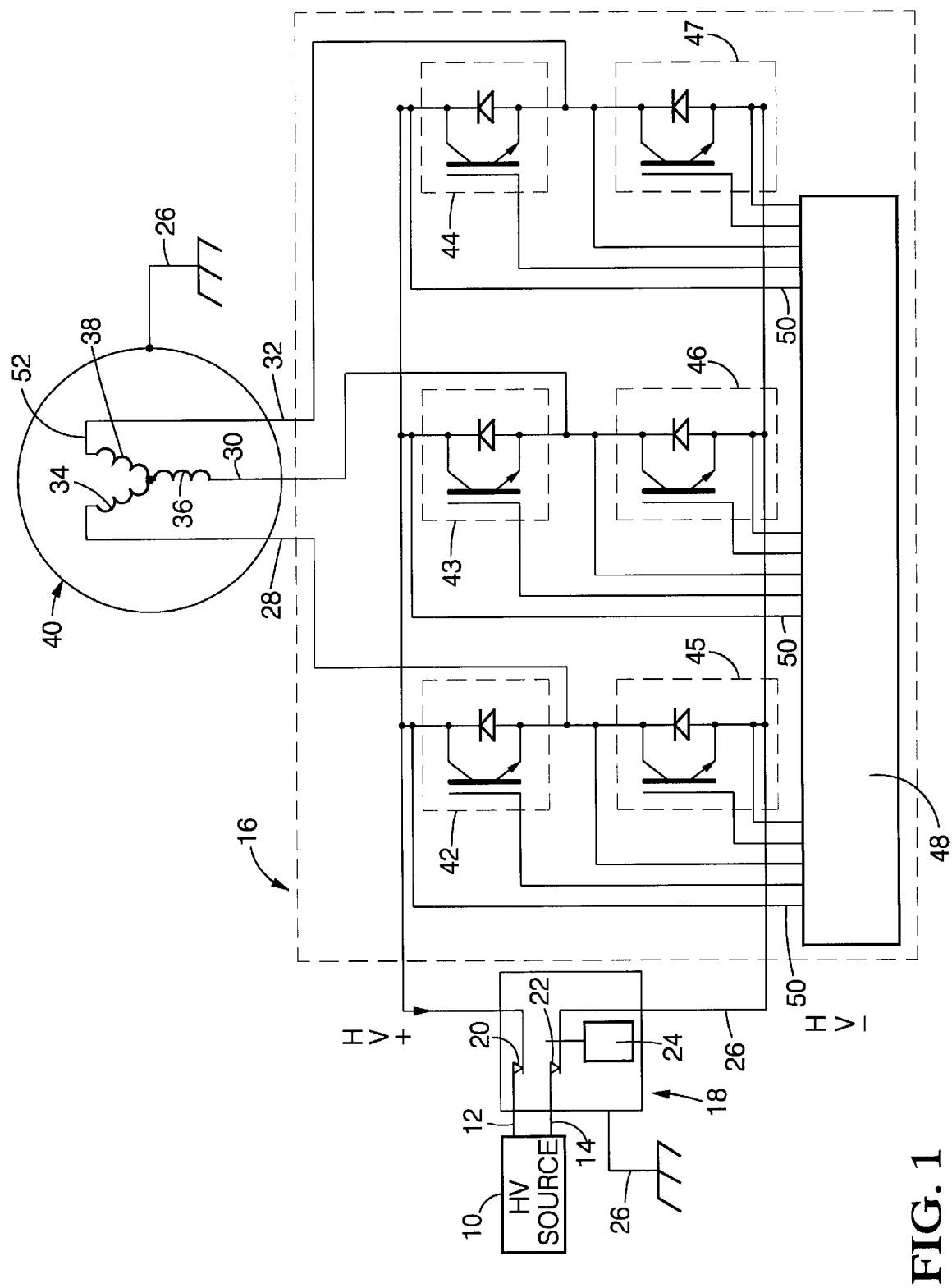
FIG. 1 is a schematic diagram motor/inverter system.

Referring to FIG. 1, a high-voltage DC power source (e.g., a battery) 10 has a positive line 12 and a negative line 14 which together comprise a DC high-voltage bus. The DC high voltage bus is connected to an inverter 16 through a ground fault circuit interrupter 18. The ground fault circuit interrupter 18 is well known and includes a pairs of separable contacts 20, 22 that are separated by the actuation of a solenoid 24 (which is responsive to a fault detection signal). The ground fault circuit interrupter 18 is also tied to chassis ground 26. Output lines 28, 30, and 32 of the inverter 16 are connected across windings 34, 36, and 38 of a motor 40 (e.g., a drive motor, a compressor motor, or a power steering motor). As described in more detail hereinafter, the inverter 16 converts the DC high-voltage to an AC input for driving the motor 40.

Inverter 16 comprises, e.g., six insulated gate bipolar transistors (IGBT) 42–47, or other high voltage semiconductor switches, and a controller (microprocessor) 48. Positive line 12 is connected to the collectors of IGBTs 42–44 and negative line 14 is connected to the emitters of IGBTs 45–47. The emitter of IGBT 42 is connected to the collector of IGBT 45, which are also connected (line 28) to winding 34 of motor 40. The emitter of IGBT 43 is connected to the collector of IGBT 46, which are also connected (line 30) to winding 36 of motor 40. The emitter of IGBT 44 is connected to the collector of IGBT 47, which are also connected (line 32) to winding 38 of motor 40. Controller 48 is connected to each of the IGBTs 42–47 by a plurality of lines 50, with the lines connected to the gates of the IGBTs 42–47 controlling the state (i.e., on and off) of the IGBTs. More specifically, when an IGBT is on current flows from its collector to its emitter and when it is off current does not flow therethrough. By way of example, when IGBT 42 is on the positive high-voltage is applied to winding 34, when IGBT 43 is on the positive high-voltage is applied to winding 36, when IGBT 44 is on the positive high-voltage is applied to winding 38, when IGBT 45 is on the negative high-voltage is applied to winding 34, when IGBT 46 is on the negative high-voltage is applied to winding 36, and when IGBT 47 is on the negative high-voltage is applied to winding 38. The controller 48 processes measurements of high-voltage for the purposes of issuing a fault detection signal to cause the solenoid 24 of the ground fault circuit interrupter 18 to separate the contacts 20, 22. A broken line 52 between winding 38 and chassis ground 26 illustrates an exemplary ground fault.

Controller 48 provides for detection of a fault by controlling the IGBTs 42–47 at a low frequency (within the bandwidth of the ground fault circuit interrupter 18) so that any leakage to the chassis ground 26 will occur for a sufficient duration to be detected. This technique is employed in an electric or hybrid vehicle when the vehicle is not under power or is at a standstill. The sequence of switching the IGBTs is controlled to yield no net current in the motor windings other that leakage current resulting from a fault. In an exemplary embodiment of the invention, such switching can be achieved using the sequence provided in a TABLE below.

TABLE

| State | IGBT 42 | IGBT 45 | IGBT 43 | IGBT 46 | IGBT 44 | IGBT 47 |
| --- | --- | --- | --- | --- | --- | --- |
| Isolation Fault Detect A | On | Off | On | Off | On | Off |
| Isolation Fault Detect B | Off | On | Off | On | Off | On |
| Normal Operation | X | X | X | X | X | X |

A zero-vector is defined herein as switch sequences or combinations that do not result in net voltage induced across a three-phase motor 40 connected to the inverter 16. Isolation Fault Detect A and B may be used alternately to detect an isolation fault, or the IGBTs may be sequenced on then off, one at a time, for example, IGBT 42⇒IGBT 43⇒IGBT 44⇒IGBT 45⇒IGBT 46⇒IGBT 47. It is noted that either approach would be defined as application of no net voltage across the motor windings.

Alternatively, controller 48 provides for detection of a fault (e.g., the fault illustrated by line 52) by connecting at least one of the windings 34, 36, 38 of motor 40 to a DC high-voltage for a period of time necessary to detect a specified fault level, i.e., given capacitance of the DC bus and the need to energize the motor winding(s) for "t" seconds to detect an isolation fault of a specified number of ohms.

Figure 2:
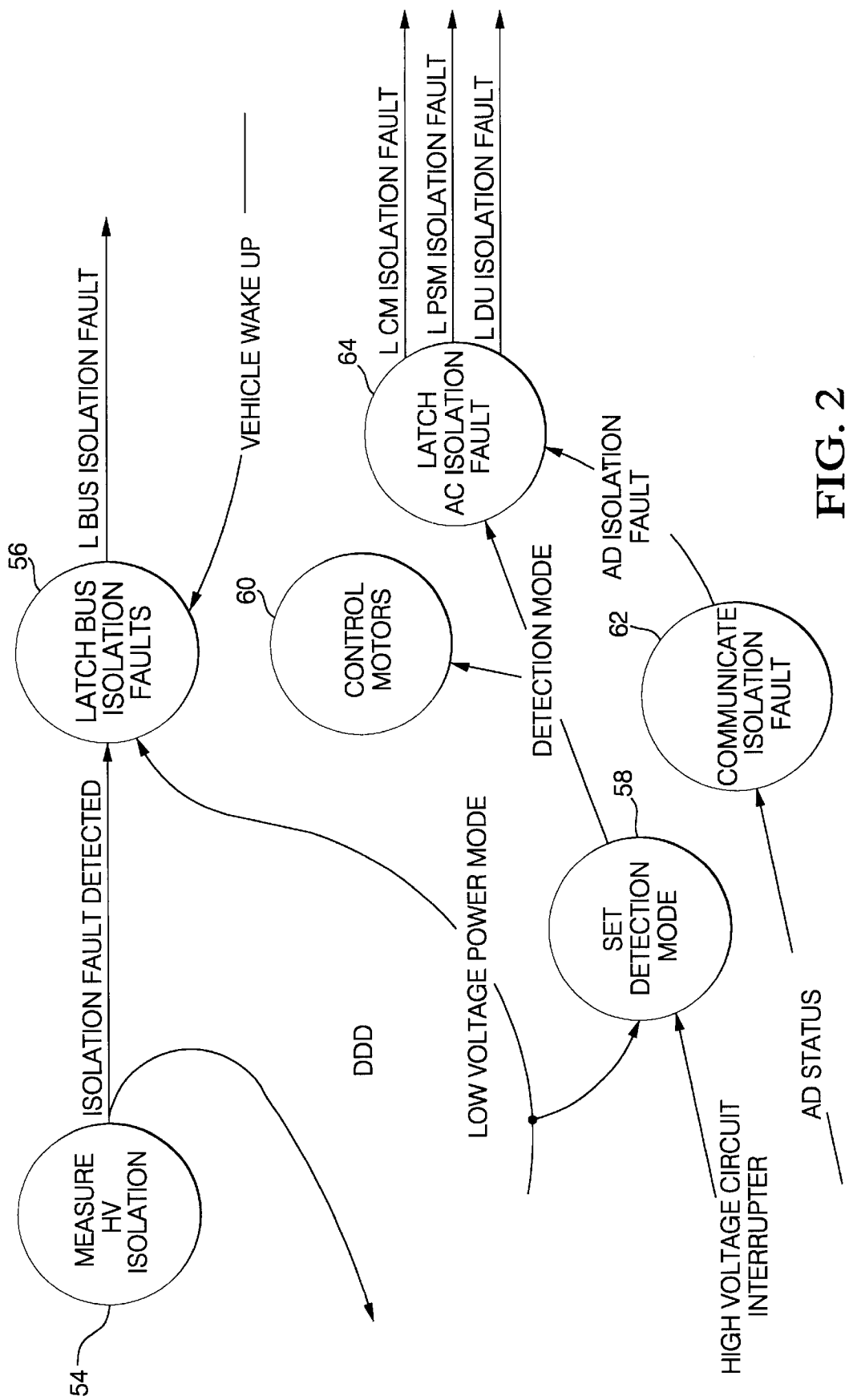
FIG. 2 is a structure diagram of a method for detecting an isolation fault in accordance with the present invention.

Referring to FIG. 2, a top-level structure diagram of this process is generally shown. A measurement of high-voltage isolation is initiated at a module 54. The high-voltage isolation measurement is latched at a module 56. Isolation fault detection mode is initiated at a module 58 for the control motors at a module 60. An isolation fault is communicated at a module 62 to latch the fault at a module 64. This process is initialize at module 54 by setting Isolation_Fault_Detected=FALSE. Thereafter, when the resistance between the positive line 12 relative to vehicle chassis ground 26 and the negative line 14 relative to vehicle chassis ground 26, are respectively equal and greater than, e.g., 650 KΩ, set Isolation_Fault_Detected=FALSE. Set Isolation_Fault_Detected=TRUE when the resistance between the positive line 12 relative to vehicle chassis ground 26 or the negative line 14 relative to vehicle chassis ground 26, are individually is less than, e.g., 500 KΩ continuously for a specified time period, e.g., 42 seconds for a fault resistance of 500,000 ohms and 0.115 seconds for a fault resistance of 5,500 ohms.

Figure 3:
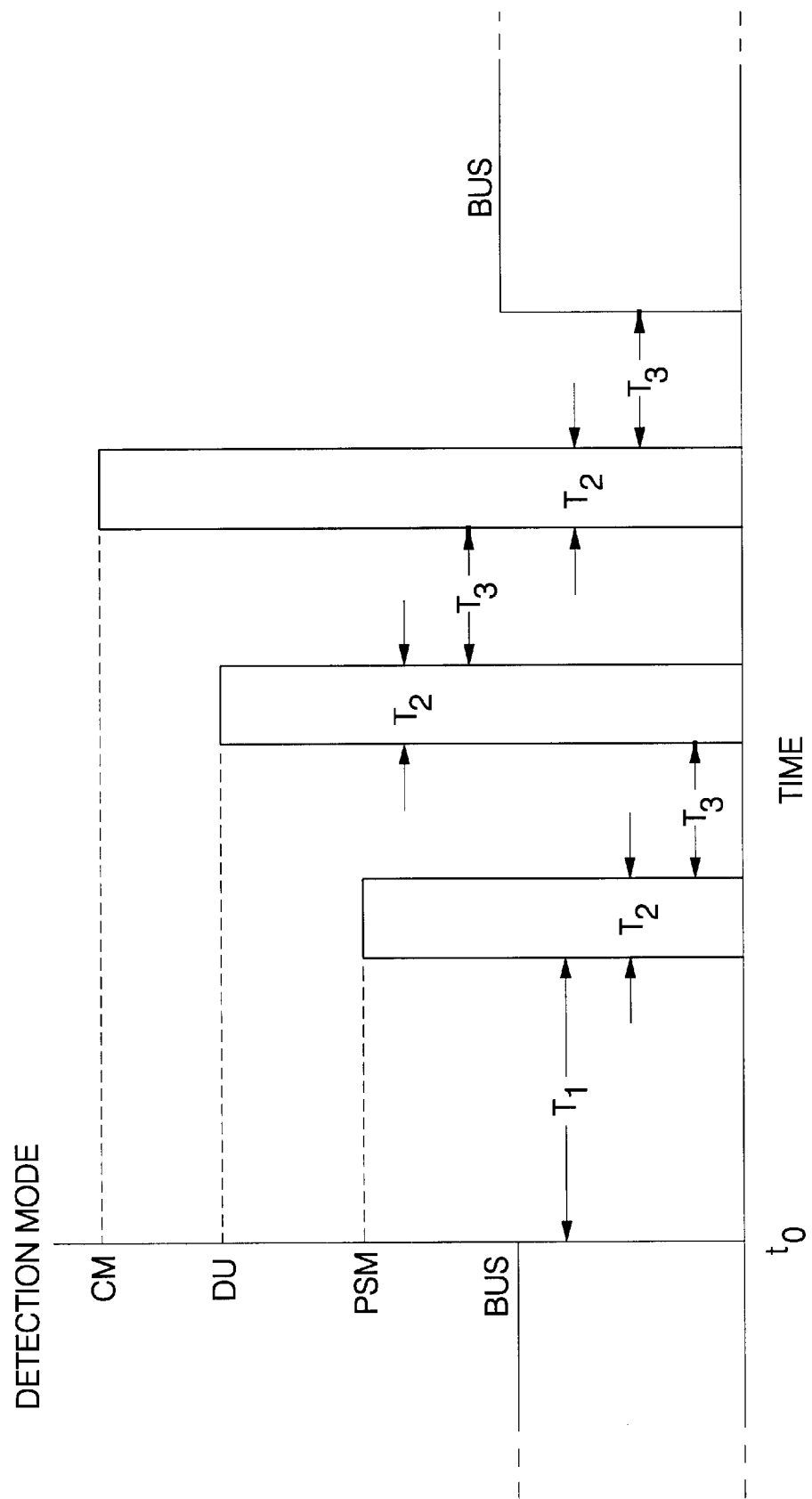
FIG. 3 is a state transition diagram showing a sequence of time intervals of the present invention.

Isolation detection mode at module 58 has inputs Low_Voltage_Power_Mode and High_Voltage_Circuit_Interrupter_Open with an output of Detection_Mode. This is initialize by setting Detection_Mode=BUS. Referring to FIG. 3, a state transition diagram showing a sequence of time intervals having functional relationship with the detection mode is generally shown. The normal operation of the high voltage bus is interrupted during standstill. At time to, the state transition is defined as follows: a time interval $T_1$ is defined as $T_1$=500±25 ms; at the end of time interval $T_1$, a time interval $T_2$ is defined as $T_2$=125±6 ms; during the time interval $T_2$, motor 40 (e.g., power steering motor) is tested for isolation fault; upon the expiration of the time interval $T_2$, the system waits for a time interval $T_3$, defined as $T_3$=250±13 ms; sequentially, the ground fault of other motors, e.g., compressor or drive motors are similarly tested. It will be appreciated that ant number of motors and priority thereof can be tested this way.

In setting the detection mode, the controller will cause a "wait for next transition to RUN" state to move to a "wait for high voltage circuit interrupter" state if Low_Voltage_Power_Mode moves from a OFF or OFF/ACC to RUN state. Reciprocally, the controller will cause a "wait for high voltage circuit interrupter" state to move to a "wait for next transition to RUN" state and reset $t_0$ if High_Voltage_Circuit_Interrupter_Open=FALSE and Low_Voltage_Power_Mode=RUN.

The latch fault at module 64 has inputs Low_Voltage_Power_Mode, Isolation_Fault_Detected and Vehicle_Wake_Up with L_Bus_Isolation_Fault as its output. Upon activation of L_Bus_Isolation_Fault=FALSE, the controller will cause the L_Bus_Isolation_Fault=FALSE state to change to the L_Bus_Isolation_Fault=TRUE state if Isolation_Fault_Detected=TRUE and Low_Voltage_Power_Mode≠RUN or Low_Voltage_Power_Mode has transferred to RUN for more than 2.0 seconds. Similarly, the controller will cause the L_Bus_Isolation_Fault=TRUE state to change to the L_Bus_Isolation_Fault=FALSE state if Isolation_Fault_Detected=FALSE and Low_Voltage_Power_Mode transfers to RUN or Isolation_Fault_Detected=FALSE and Vehicle_Wake_Up transition from FALSE to TRUE.

The fault communication at module 62 reads a high voltage circuit interrupter status, sets an isolation fault bit if an isolation fault has occurred and communicates this information for further processing. The fault communication at 62 has an input of AD_Status and an output of AD_Isolation_Fault. When AD_Status=Isolation_Fault, set AD_Isolation_Fault=TRUE and communicate this information for further processing. Whenever AD_Status≠Isolation_Fault, set AD_Isolation_Fault=FALSE and communicate this information for further processing.

The fault latch at module 64 latches the detection of an isolation fault for a specified time. The source of an isolation fault can identified, e.g., which motor. L_AC_Isolation_Fault is used to indicate a generic, latched isolation fault. The Detection_Mode=AC is used to indicate the generic isolation detection mode. Module 64 has inputs AD_Isolation_Fault and Detection_Mode with an output of L_AC_Isolation_Fault. Upon activation of: L_AC_Isolation_Fault=FALSE. The controller will cause the L_AC_Isolation_Fault=FALSE state to change to the L_AC_Isolation_Fault=TRUE state if AC_Isolation_Fault=TRUE within a 350 milliseconds window following the transition of Detection_Mode form UNDEFINED to AC. Similarly, the controller will cause the L_AC_Isolation_Fault=TRUE state to change to the L_AC_Isolation_Fault=FALSE state if AC_Isolation_Fault remains FALSE throughout the 350 ms window following the transition of Detection_Mode from UNDEFINED to AC and Low_Voltage_Power_Mode transfers to RUN state.

The control motor module 60 overrides primary motor control when each of the motors is checked for isolation. Module 60 has an input of Detection_Mode. If Detection_Mode=DM, then the primary control of the drive motor (DM) is overridden. The three phases (windings) of a drive motor (DM) are coupled electrically to the positive line 12. Otherwise, motor phase control shall revert to meeting all other functional performance requirements. Similarly, if the Detection_Mode=CM, then the primary control of the compressor motor (CM) is overridden. The three phase (windings) of the compressor motor (CM) are coupled electrically to the positive line 12. Otherwise, motor phase control shall revert to meeting all other functional performance requirements. Furthermore, this similarity extends to other multi-phase motors to be tested as well. For example, if the Detection_Mode=PSM, then the primary control of the power steering motor (PSM) is overridden. The three phase (windings) of the power steering motor (PSM) are coupled electrically to the positive side of the DC high voltage bus.

While preferred embodiments have been shown and described, various modifications and substitutions may be made thereto without departing from the spirit and scope of the invention. Accordingly, it is to be understood that the present invention has been described by way of illustrations and not limitation.

What claimed is:

1. A method for detecting an isolation fault in a system comprising a source connected an inverter through a circuit interrupter, the inverter connected to windings of an electric motor for driving the electric motor, said method comprising:

operating the inverter to yield a zero net current in the windings of the electric motor other than leakage current resulting from an isolation fault; and measuring a voltage in the system, wherein a voltage level measured during said operating of the inverter to yield the zero net current in the windings of the electric motor is indicative of the existence of the isolation fault.

2. The method of claim 1 further comprising:

actuating the circuit interrupter in response to the voltage level indicative of the existence of the isolation fault.

3. The method of claim 1 wherein said operating the inverter to yield the zero net current in the windings of the electric motor comprises operating the inverter at a low frequency within an operating bandwidth of the circuit interrupter.

4. The method of claim 1 wherein the isolation fault comprises a ground isolation fault.

5. The method of claim 1 wherein the isolation fault comprises a galvanic isolation fault.

6. The method of claim 1 wherein the source comprises a high-voltage direct current source.

7. The method of claim 1 wherein the circuit interrupter is a ground fault circuit interrupter.

8. The method of claim I wherein the electric motor comprises an electric motor of an electric or hybrid vehicle.

9. The method of claim 1 wherein the inverter comprises a plurality of insulated gate bipolar transistors and a controller connected thereto for controlling the insulated gate bipolar transistors.

* * * * *